United States Patent
Chen et al.

(10) Patent No.: US 10,304,848 B2
(45) Date of Patent: May 28, 2019

(54) FLASH MEMORY STRUCTURE WITH REDUCED DIMENSION OF GATE STRUCTURE

(71) Applicant: Taiwan Semiconductor Manufacturing Co., Ltd., Hsinchu (TW)

(72) Inventors: Sheng-Chieh Chen, Taichung (TW); Ming Chyi Liu, Hsinchu (TW); Shih-Chang Liu, Taiwan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/694,611

(22) Filed: Sep. 1, 2017

(65) Prior Publication Data
US 2019/0074285 A1    Mar. 7, 2019

(51) Int. Cl.
| | |
|---|---|
| *H01L 21/28* | (2006.01) |
| *H01L 29/49* | (2006.01) |
| *H01L 29/51* | (2006.01) |
| *H01L 21/311* | (2006.01) |
| *H01L 23/522* | (2006.01) |
| *H01L 23/528* | (2006.01) |
| *H01L 23/532* | (2006.01) |
| *H01L 29/423* | (2006.01) |
| *H01L 21/3213* | (2006.01) |
| *H01L 27/11568* | (2017.01) |

(52) U.S. Cl.
CPC .. *H01L 27/11568* (2013.01); *H01L 21/28282* (2013.01); *H01L 21/31111* (2013.01); *H01L 21/31144* (2013.01); *H01L 21/32133* (2013.01); *H01L 29/42344* (2013.01); *H01L 29/4983* (2013.01); *H01L 29/513* (2013.01); *H01L 29/518* (2013.01); *H01L 23/528* (2013.01); *H01L 23/5226* (2013.01); *H01L 23/53261* (2013.01)

(58) Field of Classification Search
CPC ..... H01L 51/56; H01L 33/32; H01L 51/5012; H01L 51/5056; C09K 11/06
USPC ........................................................ 257/324
See application file for complete search history.

(56) References Cited

U.S. PATENT DOCUMENTS

| | | |
|---|---|---|
| 7,064,022 B1 | 6/2006 | Hill et al. |
| 8,847,293 B2 | 9/2014 | Lee et al. |
| 8,896,063 B2 | 11/2014 | Adam et al. |
| 8,981,496 B2 | 3/2015 | Liu et al. |

(Continued)

*Primary Examiner* — Andy Huynh
(74) *Attorney, Agent, or Firm* — Slater Matsil, LLP

(57) ABSTRACT

An integrated circuit for a flash memory device with enlarged spacing between select and memory gate structures is provided. The enlarged spacing is obtained by forming corner recesses at the select gate structure so that a top surface with a reduced dimension of the select gate structure is obtained. In one example, a semiconductor substrate having memory cell devices formed thereon, the memory cell devices includes a semiconductor substrate having memory cell devices formed thereon, the memory cell devices includes a plurality of select gate structures and a plurality of memory gate structures formed adjacent to the plurality of select gate structures, wherein at least one of the plurality of select gate structures have a corner recess formed below a top surface of the at least one of the plurality of select gate structures.

20 Claims, 8 Drawing Sheets

(56) References Cited

U.S. PATENT DOCUMENTS

| | | |
|---|---|---|
| 9,123,826 B1 | 9/2015 | Harley et al. |
| 9,196,613 B2 | 11/2015 | Basker et al. |
| 9,331,179 B2 | 5/2016 | Liu et al. |
| 9,391,085 B2 | 7/2016 | Huang et al. |
| 9,431,257 B2 | 8/2016 | Liu |
| 9,502,515 B2 | 11/2016 | Tseng et al. |
| 9,548,239 B2 | 1/2017 | Lu et al. |
| 9,576,801 B2 | 2/2017 | Li et al. |
| 9,590,065 B2 | 3/2017 | Lee et al. |
| 2003/0142550 A1 | 7/2003 | Kawahara et al. |
| 2008/0029805 A1 | 2/2008 | Shimamoto et al. |
| 2008/0265286 A1 | 10/2008 | Ishimaru et al. |
| 2009/0090948 A1 | 4/2009 | Sato |
| 2011/0095348 A1 | 4/2011 | Chakihara et al. |
| 2011/0254077 A1* | 10/2011 | Lee .................. H01L 27/11529 257/324 |
| 2012/0104472 A1 | 5/2012 | Xu et al. |
| 2013/0161762 A1 | 6/2013 | Kelly et al. |
| 2013/0240977 A1 | 9/2013 | Kaneoka et al. |
| 2015/0079751 A1 | 3/2015 | Alptekin et al. |
| 2015/0115334 A1 | 4/2015 | Liaw |
| 2015/0372136 A1* | 12/2015 | Chang ................. H01L 29/7831 257/314 |
| 2015/0380568 A1* | 12/2015 | Tseng .................. H01L 29/792 257/326 |
| 2016/0056250 A1 | 2/2016 | Chuang et al. |
| 2017/0194056 A1* | 7/2017 | Heinrich-Barna ......................... G11C 16/3427 |

\* cited by examiner

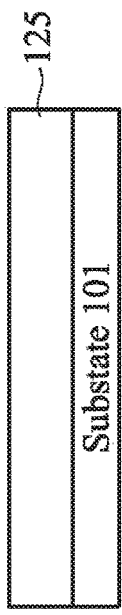
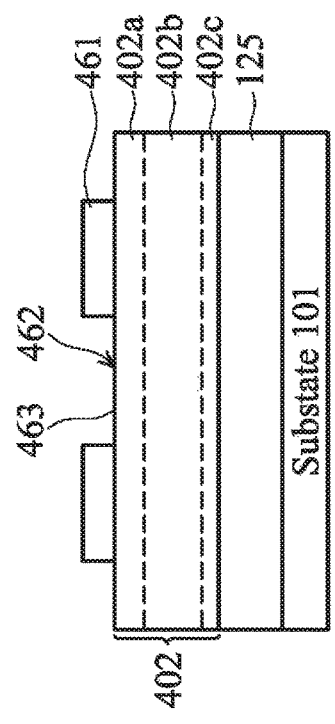
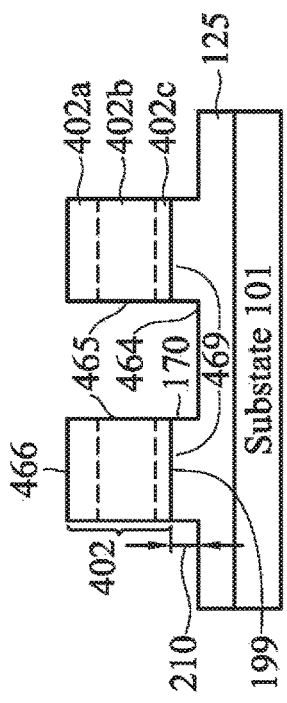

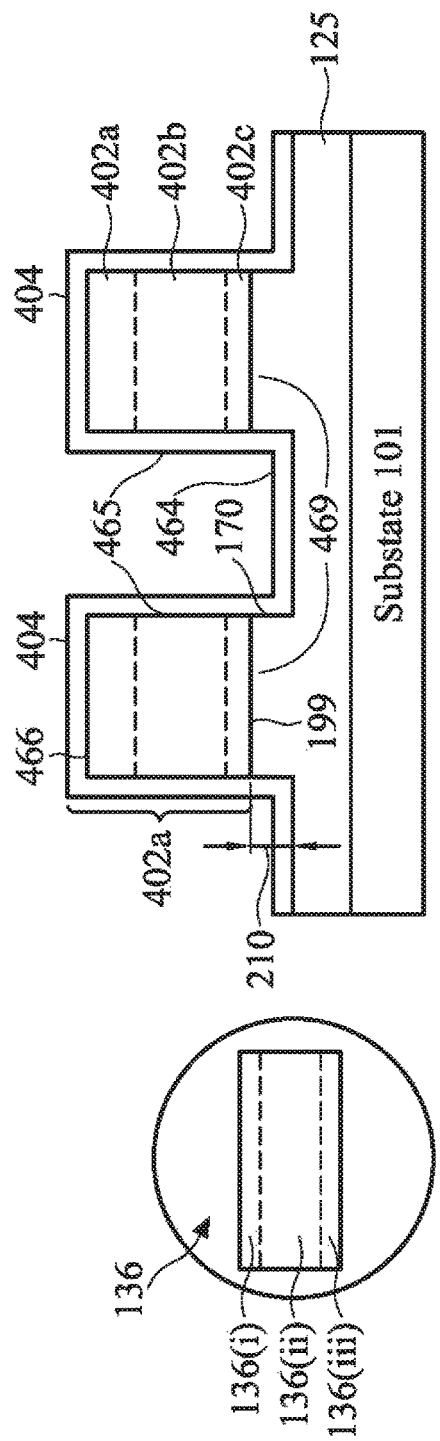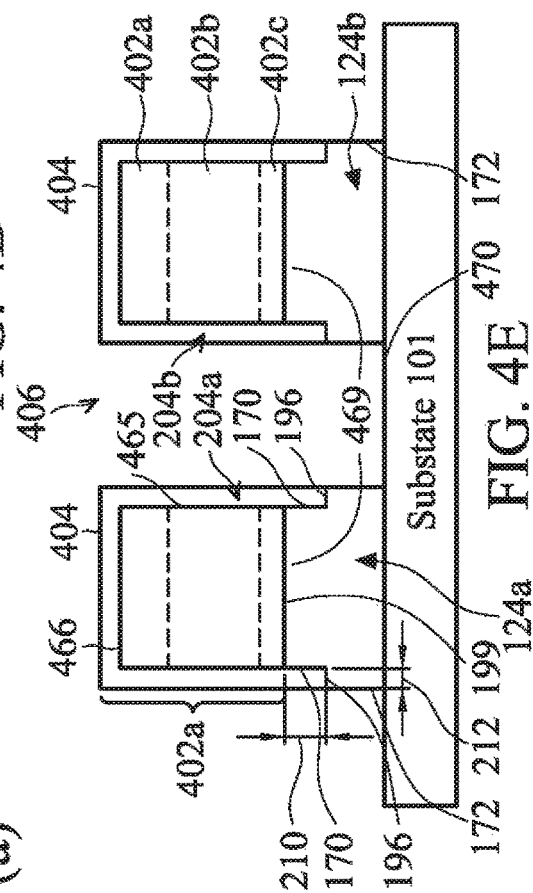
FIG. 4F(a)
FIG. 4D
FIG. 4E

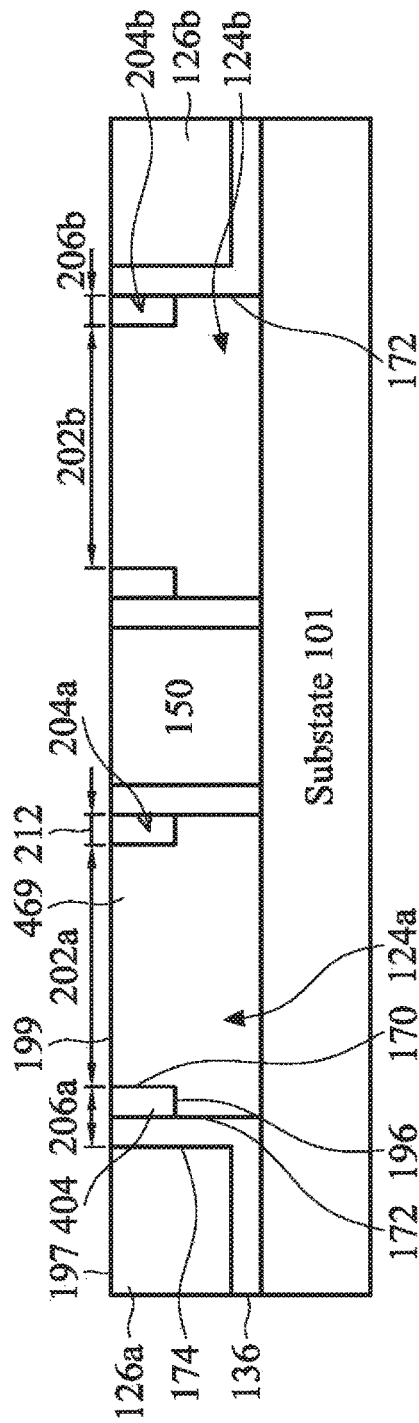
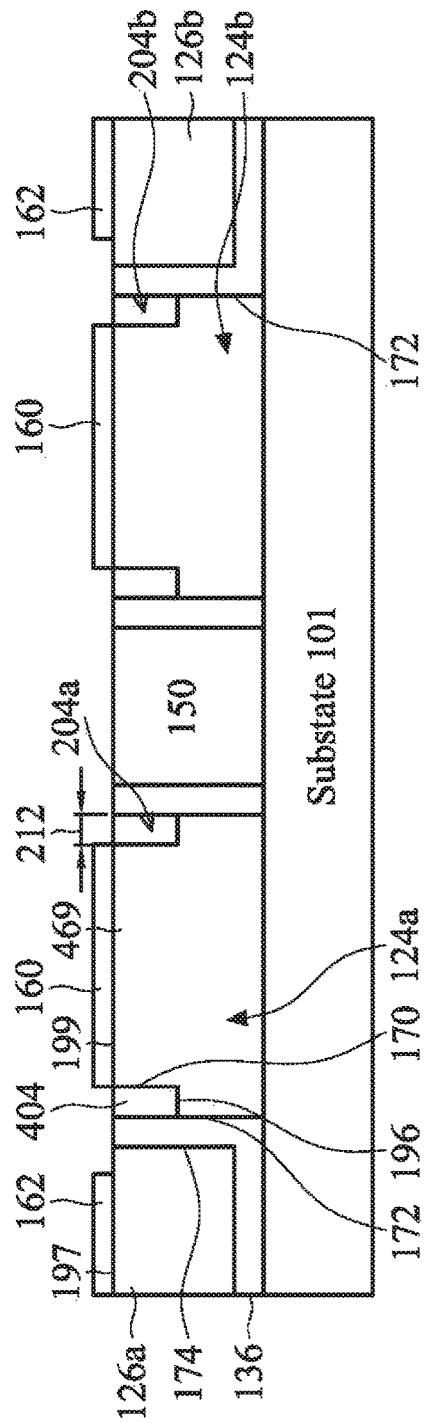

FLASH MEMORY STRUCTURE WITH REDUCED DIMENSION OF GATE STRUCTURE

BACKGROUND

Reliably producing sub-half micron and smaller features is one of the key technology challenges for next generation very large-scale integration (VLSI) and ultra large-scale integration (ULSI) of semiconductor devices. However, as the limits of circuit technology are pushed, the shrinking dimensions of VLSI and VLSI technology have placed additional demands on processing capabilities. Reliable formation of gate structures on the substrate is important to VLSI and ULSI success and to the continued effort to increase circuit density and the quality of individual substrates and dies.

Flash memory is an electronic non-volatile computer storage medium that can be electrically erased and reprogrammed. It is used in a wide variety of commercial and military electronic devices and equipment. To store information, flash memory includes an addressable array of memory cells, typically made from floating gate transistors. Common types of flash memory cells include stacked gate memory cells and split gate memory cells. Split gate memory cells have several advantages over stacked gate memory cells, such as lower power consumption, higher injection efficiency, less susceptibility to short channel effects, and over erase immunity.

However, as the device dimensions continue to be scaled down, short distances among the gate memory cells may result in current leakage. Thus, proper management of the distances and dimensions among the gate memory cells is desired to provide the device structures with desired electrical performance.

BRIEF DESCRIPTION OF THE DRAWINGS

Aspects of the present disclosure are best understood from the following detailed description when read with the accompanying figures. It is noted that, in, accordance with the standard practice in the industry, various features are not drawn to scale. In fact, the dimensions of the various features may be arbitrarily increased or reduced for clarity of discussion.

FIGS. 4A-4I depict cross sectional views of a substrate with composite structures at different stages of the manufacturing process depicted in FIG. 3 in accordance with some embodiments;

DETAILED DESCRIPTION

Figure 1A:
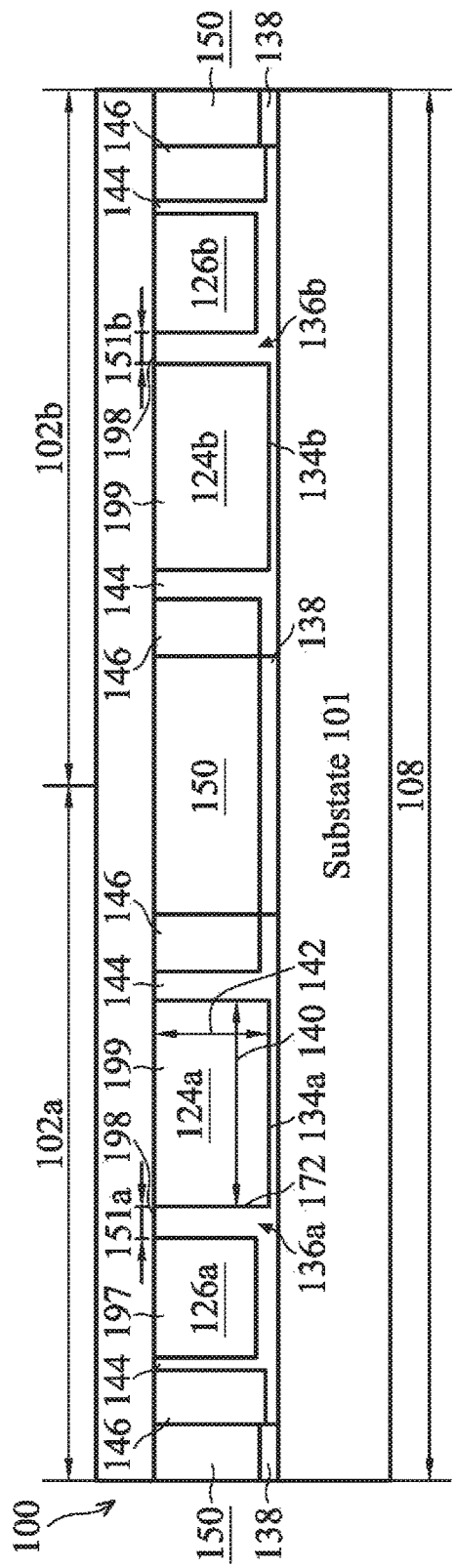
FIGS. 1A-1B depict cross-sectional views of some embodiments of a semiconductor structure with memory cell devices in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct, contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in the semiconductor manufacturing industry is to integrate different semiconductor components of a composite semiconductor device into a common semiconductor structure. Such integration advantageously lowers manufacturing costs, simplifies manufacturing procedures, and increases operational speed. One type of composite semiconductor device often integrated into a common semiconductor structure is a flash memory device. A flash memory device includes an array of flash memory cell devices and logic devices supporting operation of the flash memory cell devices. When the array of flash memory cell devices and the logic devices are integrated into a common semiconductor structure, the flash memory device is often referred to as a flash memory device.

Common types of flash memory cell devices include stacked gate flash memory cell devices and split gate flash memory cell devices. Split gate flash memory cell devices have several advantages over stacked gate flash memory cell devices, such as lower power consumption, higher injection efficiency, less susceptibility to short channel effects, and over erase immunity. Examples of split gate flash memory cell devices include silicon-oxide-nitride-oxide-silicon (SONGS) split gate flash memory cell devices, metal-oxide-nitride-oxide-silicon (MONOS) split gate flash memory cell devices, and third generation SUPERFLASH (ESF3) memory cell devices.

Flash memory devices include flash memory cell devices, which are typically formed with polysilicon gate structures insulated by silicon dioxide, as well as logic devices, such as address decoders or read/write circuitry. In forming a flash memory device according to some methods, the flash memory cell devices are formed with polysilicon gate structures while the logic devices are formed with sacrificial gate structures insulated by high dielectric constant materials. With the flash memory cell devices and the logic devices formed, silicide is formed over the source/drain regions. The silicide advantageously reduces the resistance between the source/drain regions and subsequently formed contacts. The silicide may be formed over the polysilicon gate structures as well as the source/drain regions to reduce contact resistance. Furthermore, an interlayer dielectric structure is formed over the logic and memory cell devices, and a planarization process is performed on the interlayer dielectric structure to expose the silicide on the polysilicon gate structures. However, metal contamination may occur during the planarization process which may adversely affect the memory cells. For example, as the dimension continues to shrink, the distance from a first gate structure to a neighboring second gate structure in the memory cells is relatively short. As a result, metal left over from the planarization process tends to be trapped in the short distance between the first and the second gate structure, resulting in current leakage among the memory cells.

Embodiments of a memory cell device with a first gate structure having a corner recess and a second gate structure neighboring the first gate structure are provided. The corner recess may be filled with insulating materials. The corner recess formed at a corner of a top surface of the first gate structure increases the distance from one side of the top surface of the first gate structure to another side of the top surface of the neighboring second gate structure. The silicide is then formed over the top surfaces adjacent to the corner recess on the first gate structure and the neighboring second gate structure. The corner recess enlarges the insulating region with an enlarged distance between the silicide formed on top surfaces of the first gate structure and the neighboring second gate structure. The enlarged distance provides a wider process window during the planarization process to prevent metal contamination from being trapped among the gate structures in the memory cells. The semiconductor structure with the recessed corners advantageously prevents metal from remaining on the substrate after a planarization process.

Figure 1B:
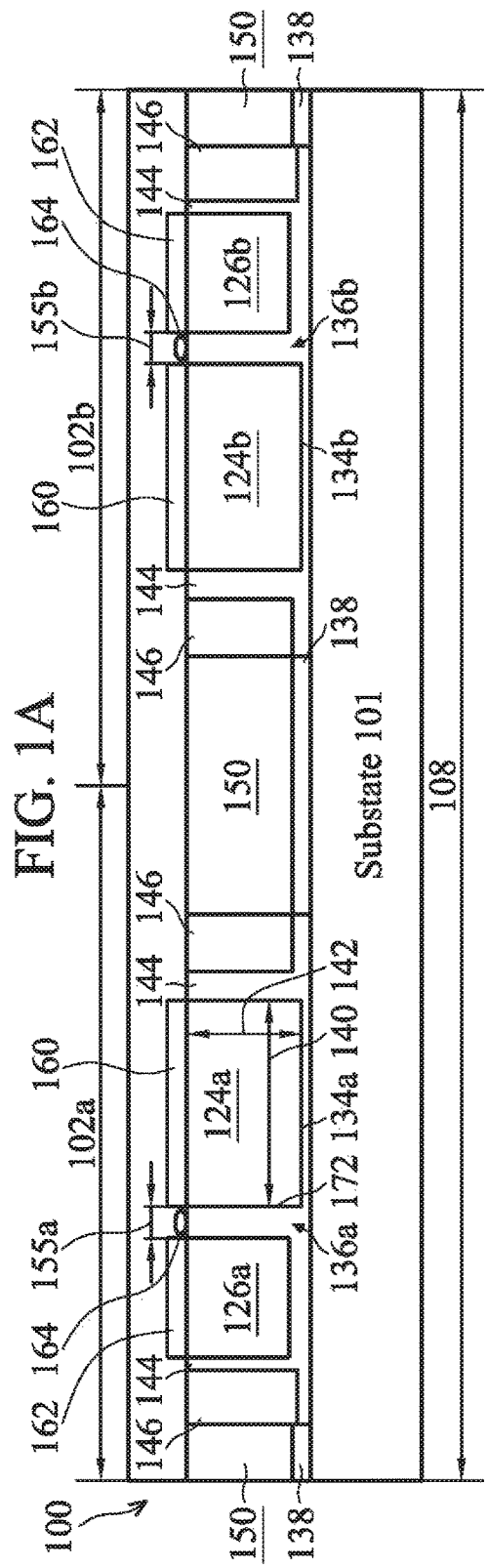

FIGS. 1A and 1B depict cross-sectional views of a portion of a semiconductor device structure 100 with memory cell devices 102 (shown, as 102a, 102b) in accordance with some embodiments. It is noted that other portions or other types of devices, such as logic devices, are not shown in the drawing for sake of clarity. The memory cell devices 102 include a first memory cell device 102a and a second memory cell device 102b. The memory cell devices 102 store data in a nonvolatile manner and are, for example, metal-oxide-nitride-oxide-silicon (MONOS) or silicon-oxide-nitride-oxide-silicon (SONGS) split gate flash memory cell devices. Some logic devices (not shown in the drawings) may coordinate to implement logic supporting operation of the memory cell devices 102 and are, for example, transistors.

In one example, the memory cell devices 102 are localized to a memory region 108 of a semiconductor substrate 101. The substrate 101 includes materials selected from at least one of crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped, silicon, germanium, gallium arsenide, glass and sapphire. In the embodiment wherein a SOI structure is utilized for the substrate 101, the substrate 101 may include a buried dielectric layer disposed on a silicon crystalline substrate. In the embodiments depicted herein, the substrate 101 is a silicon containing material, such as crystalline silicon substrate. Moreover, the substrate 101 is not limited to any particular size, shape or materials. The substrate 101 may be a round/circular substrate having a 200 mm diameter, a 300 mm diameter or other diameters, such as 450 mm, among others. The substrate 101 may also be any polygonal, square, rectangular, curved or otherwise non-circular workpiece, such as a polygonal glass substrate as needed.

The memory cell device 102 includes a select gate structure 124 (shown as 124a, 124b) in the memory region 108. A memory gate structure 126 (shown as 126a, 126b) is spaced on the substrate 101 in the memory cell device 102. In one example, the select and memory gate structures 124, 126 of the memory cell devices 102 are fabricated from polysilicon containing materials.

In one example, a top surface 199 of the select gate structure 124 has similar height to the top surfaces 197 (e.g., substantially coplanar) of the memory gate structure 126. The select gate structure 124 and the memory gate structure 126 have, for example, a generally rectangular profile.

A select gate dielectric 134 (shown as 134a, 134b) is formed between the semiconductor substrate 101 and the select gate structure 124. The select gate dielectric 134 electrically isolates the select gate structure 124 from the semiconductor substrate 101. A charge trapping dielectric 136 (shown as 136a, 136b) is formed between the semiconductor substrate 101 and the memory gate 126. The charge trapping dielectric 136 electrically isolates the memory gate structure 126 from the semiconductor substrate 101. The charge trapping dielectric 136 further extends vertically up between the memory gate structure 126 and the select, gate, structure 124 to electrically isolate the memory gate structure 126 from the select gate structure 124. The top surface 198 of the charge trapping dielectric 136 has similar height (e.g., substantially coplanar) to the top surfaces 199, 197 of the select gate structure 124 and the memory gate structure 126. The top surface 198 of the charge trapping dielectric 136 has a width 151a between about 20 nm and about 60 nm. The select gate dielectric 134 is, for example, an oxide, such as silicon dioxide material. The charge trapping dielectric 136 is, for example, a multilayer dielectric, for example a composite material having at least three layers, such as an oxide-nitride-oxide (ONO) dielectric (e.g., the oxide-nitride-oxide (ONO) dielectric materials 136(i), 136(ii), 136(iii) depicted in the enlarged view in FIG. 4F(a)) or an oxide-silicon-oxide (OSiO) dielectric material.

A main sidewall structure 144 is formed on sidewalls of the memory cell devices 102. The main sidewall structure 144 extends vertically up from the semiconductor substrate 101 to above or substantially similar height to the top surfaces 197 of the memory gate structures 126. For example, the main sidewall structure 144 extends from the semiconductor substrate 101, along sidewalls of the select gate dielectric 134 and the select gate structure 124. In one example, the main sidewall structure 144 is a dielectric material, such as a silicon nitride material.

An interlayer dielectric material 152 extends from the semiconductor substrate 101 over top surfaces 199, 198, 197 of the select and memory gate structures 124, 126 and the charge trapping layer 136. The interlayer dielectric material 152 further includes an interlayer insulating substructure 150 covering the memory cell 102 (or logic cells, which are not shown here) formed on the semiconductor substrate 101. A source/drain silicide contact pads 138 is formed under the interlayer insulating substructure 150 and above the substrate 101. In some embodiments, the silicide contact pads 138 have a thickness of about 50 Å-200 Å. The silicide contact pads 138 reduce resistance between the source/drain regions (not shown) in the substrate 101 and the memory gate structures 126 by providing a better and lower resistance contact surface. In some embodiments, the interlayer insulating substructure 150 has a top surface having similar height (e.g., substantially coplanar) to the top surfaces of the memory cell 102. In some embodiments, the interlayer dielectric material 152 has a bottom surface in contact with the top surfaces of the interlayer insulating substructure 150 and the memory cell 102, including the top surfaces 199, 197 of the select and memory gate structures 124, 126. In one example, the interlayer dielectric material 152 along with the interlayer insulating substructure 150 is fabricated from an insulating material, such as a silicon oxide material, low-k material, or other suitable materials as needed.

Memory silicide contact pads 160, 162 are formed over upper top surfaces 199, 197 of the select gate structure 124 and the memory gate structures 126, as shown in FIG. 1B. The silicide contact pads 138 are, for example, nickel silicide, cobalt silicide, or titanium silicide. However, as discussed above, due to the space constraint defined by the width 151a of the charge trapping dielectric 136, when a planarization process is performed, excess or redundant silicide metal 164 polished away from the memory silicide contact pads 160, 162 may be trapped or adhered at the surface 198 of the charge trapping dielectric 136, leaving undesired redundant silicide metal 164 on the surface 198 of the charge trapping dielectric 136. The limited dimension defined between the top surfaces 199, 197 of the select and memory gate structures 124, 126 often creates a concave structure in the memory devices 102 that traps the redundant silicide metal 164 and makes the redundant silicide metal 164 hard to be removed in subsequent cleaning processes. Such metal contamination may bridge the memory silicide contact pads 160, 162 formed in the select and memory gate structures 124, 126 individually, resulting in current leakage and short circuit.

In one example, the memory silicide contact pad 160, 162 is fabricated from a nickel (Ni) and/or platinum (Pt) alloy. During the silicidation process, the nickel elements react with the silicon materials from the gate structures to form nickel silicide, such as the memory silicide contact pad 160, 162. The platinum may be precipitated from the nickel silicide on the substrate surface as a metal contaminant 164. In the subsequent planarization process, the relative movement between the substrate 101 and the polishing head often causes the platinum from the redundant silicide metal 164 to be trapped in, the constraint space (e.g., the width 155a or the width 151a shown in FIGS. 1A and 1B) above the surface 198 of the charge trapping dielectric 136 and the top surface 197 of the memory gate, structure 126. The trapped redundant silicide metal 164 may partly bridge the conductive features in the select and memory gate structures 124, 126, resulting in the undesired current leakage and short circuit.

In one example, the select gate structure 124 may have a substantially rectangular or square form having an outer sidewall 172 in contact with the charge trapping dielectric 136. For example, the select gate structure 124 may have a horizontal width 140 (e.g., parallel to a bottom surface 159 of the select gate structure 124) of between about 70 nm and about 90 nm, such as about 85 nm. The selected gate structure 124 may have a vertical height 142 (e.g., parallel to the outer sidewall 172 of the select gate structure 124) of between about 70 nm and about 90 nm, such as about 85 nm (as shown in FIG. 1B).

Figure 2A:
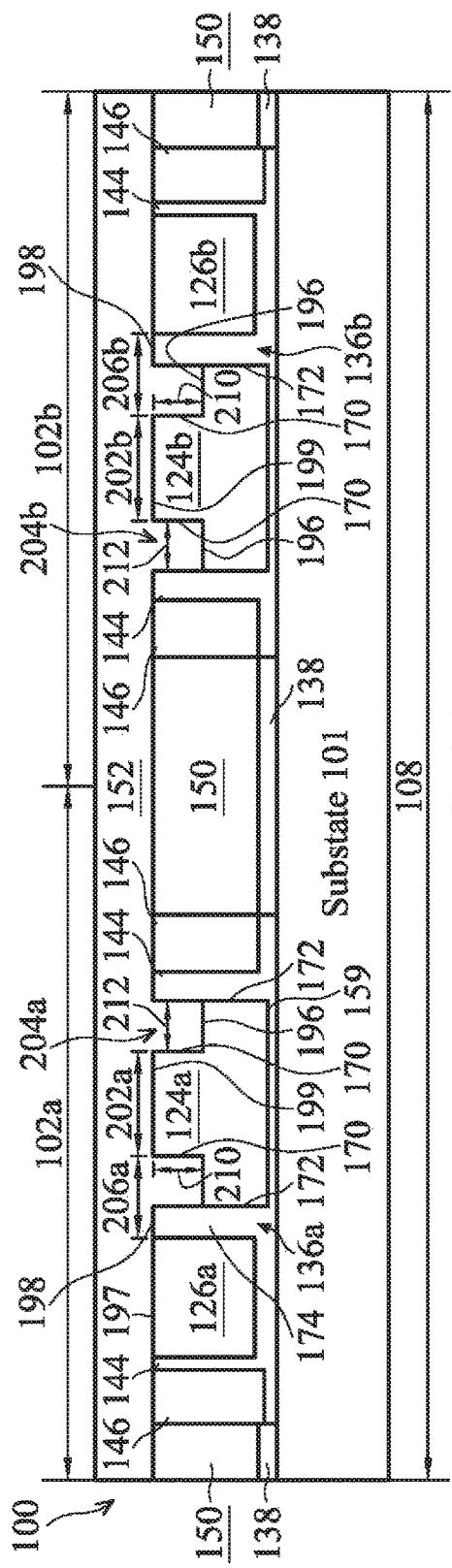
FIGS. 2A-2B depict cross-sectional views of some embodiments of a semiconductor structure with memory cell devices in accordance with some embodiments.
Figure 2B:
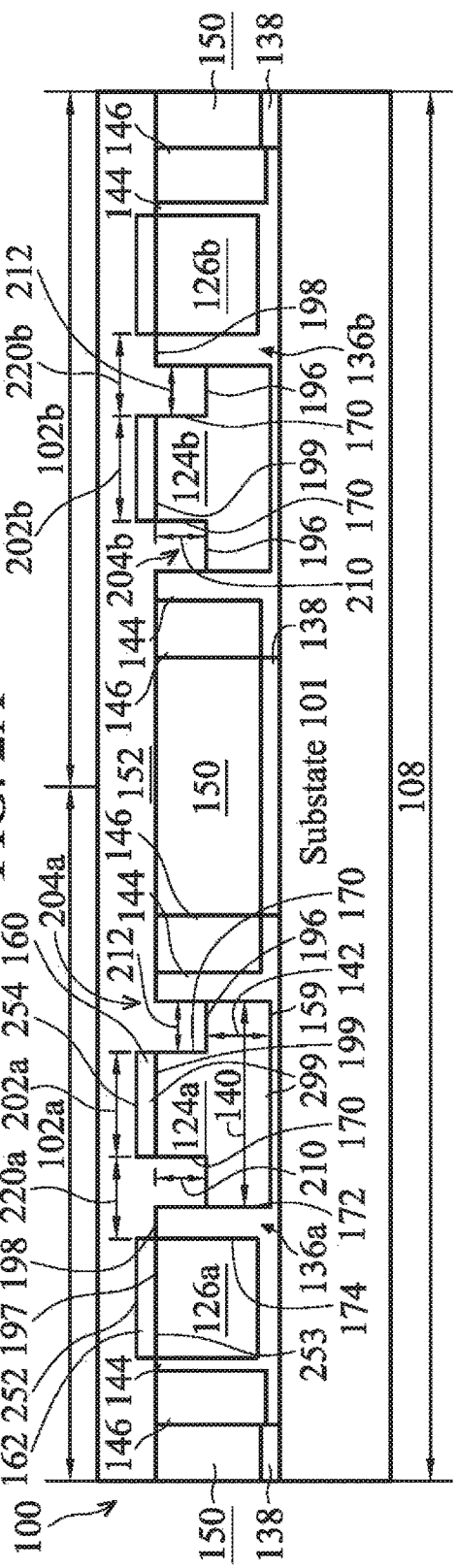

FIG. 2A-2B depicts cross-sectional views of a portion of the semiconductor device structure 200 with memory cell devices 102a, 102b with corner recesses 204a, 204b formed in the select gate structures 124a, 124b. The corner recesses 204a, 204b define a lower surface 196 (e.g., a bottom surface) having a step height 210 from the top surface 199 of the select gate structure 124. The corner recesses 204a, 204b have a width 212 defined between an inner sidewall 170 and the outer sidewall 172 of the select gate structure 124. The width 212 defined by the corner recesses 204a, 204b enlarges a spacing 206 (shown as 206a, 206b) between the inner sidewall 170 of the select gate structure 124 and a shared sidewall 174 shared between the charge trapping layer 136 and the memory gate structures 126.

As further shown in FIG. 2B, after the silicidation process, the memory silicide contact pad 162 is formed on the top surface 197 of the memory gate structure 126 and the memory silicide contact pad 160 having the reduced dimension 202 (shown as 202a, 202b) is formed on the top surface 199 of the select gate structure 124. It is noted that some of the silicon materials from the memory and select gate structure 126,124 from the top surfaces 197, 199 may be consumed to form the memory silicide contact pad 160, 162, defining new top surfaces 252, 254 of the memory silicide contact pad 162, 160. The new top surfaces 252, 254 are slightly above the top surface 197, 198 from the memory gate structure 126 and the charge trapping layer 136. The bottom surfaces 253, 299 of the memory silicide contact pad 162, 160 are slightly below top surface 197, 198 from the memory gate structure 126 and the charge trapping layer 136.

The corner recesses 204a, 204b allow the memory silicide contact pad 162, 160 to have an enlarged spacing 220 (shown as 220a, 220b) greater than the original width 155a so that the unreacted or redundant metal from the silicidation process would not be trapped or embedded into the charge trapping layer 136 or partly embedded into the memory gate 126 structure or select gate structure 124 after the planarization process. In one example, the enlarged spacing 220a, 220b is about 10 percent to about 30 percent greater than the original spacing 155a, 155b (as shown in FIG. 1B) after the memory silicide contact pads 162, 160 are formed. In one example, the enlarged spacing 220 (shown as 220a, 220b) after the memory silicide contact pads 162, 160 are formed is slightly greater than the spacing 206 (shown as 206a, 206b) from FIG. 2A as the enlarged spacing 220 may include an additional small area above the memory gate structure 126 that does not have the memory silicide contact pad.

The corner recesses 204 (as shown in FIG. 2B) have a width 212 (in horizontal direction) between about 10 nm and about 15 nm and a step height 210 (in vertical direction) between about 10 nm and about 40 nm, such as between 10 nm and 20 nm. The reduced dimension 202a of the memory silicide contact pad 160 is between about 30 nm and about 40 nm. The width 212 in horizontal direction of the corner recesses 204a, 204b is about 10 percent to about 30 percent shorter than the total horizontal width 140 of the select gate structure 124. The step height 210 in vertical direction of the corner recesses 204a, 204b is about 10 percent to about 30 percent shorter than the total vertical depth 142 of the select gate structure 124. The corner recesses 204a, 204b are also substantially in the form of rectangular or square configurations.

The corner recesses 204 provides the enlarged spacing 206a, 206b, as shown in FIG. 2A, for an edge (e.g., the inner walls 170) of the select gate structure 124 passing through the top surface 198 of the charge trapping layer 136 then to the edge (e.g., a sidewall 174) of the memory gate structure 126. The enlarged spacing 206a, 206b is between about 40 nm and about 80 nm, such as about 15 percent and about 40 percent larger than the spacing 151a (shown in FIG. 1A) without the extra width 212 provided from the corner recesses 204.

In operation, each memory cell device 102 stores a variable amount of charges, and/or electrons, in the charge trapping dielectric 136. The charge is advantageously stored in a non-volatile manner so that the stored charge persists in the absence of power. The amount of charge stored in the charge trapping dielectric 136 represents a value, such as binary value, and is varied through program (i.e., write), read, and erase operations. These operations are performed through selective biasing of the select gate structure 124 and the memory gate structure 126.

During a program or erase operation of the memory cell device 102, the memory gate structure 126 is forward or reverse biased with a high (e.g., at least an order of magnitude higher) voltage relative to a voltage applied to the select gate structure 124. In some embodiments, forward biasing is used for a program operation, and reverse biasing is used for an erase operation. During a program operation, the high bias voltage promotes Fowler-Nordheim tunneling of carriers from the channel region formed in the substrate towards the memory gate structure 126. As the carriers tunnel towards the memory gate structure 126, the carriers become trapped in the charge trapping dielectric 136. During an erase operation, the high bias voltage promotes Fowler-Nordheim tunneling of carriers in the charge trapping dielectric 136 away from the memory gate 126. As the carriers tunnel away from the memory gate structure 126, the carriers become dislodged or otherwise removed from the charge trapping dielectric 136. Charge stored in the charge trapping, dielectric 136 of a memory cell device 102 screens an electric field formed between the memory gate 126 and the channel region 114 when the memory gate structure 126 is biased. During a read operation, a voltage is applied to the select gate structure 124 to induce part of the channel region in the substrate to conduct. Application of a voltage to the select gate structure 124 attracts carriers to part of the channel region 114 adjacent to the select gate structure 124. If the memory cell device 102 turns on (i.e., allows charge to flow), then it stores a first data state (e.g., a logical "0"). If the memory cell device 102 does not turn on, then it stores a second data state (e.g., a logical "1").

Figure 3:
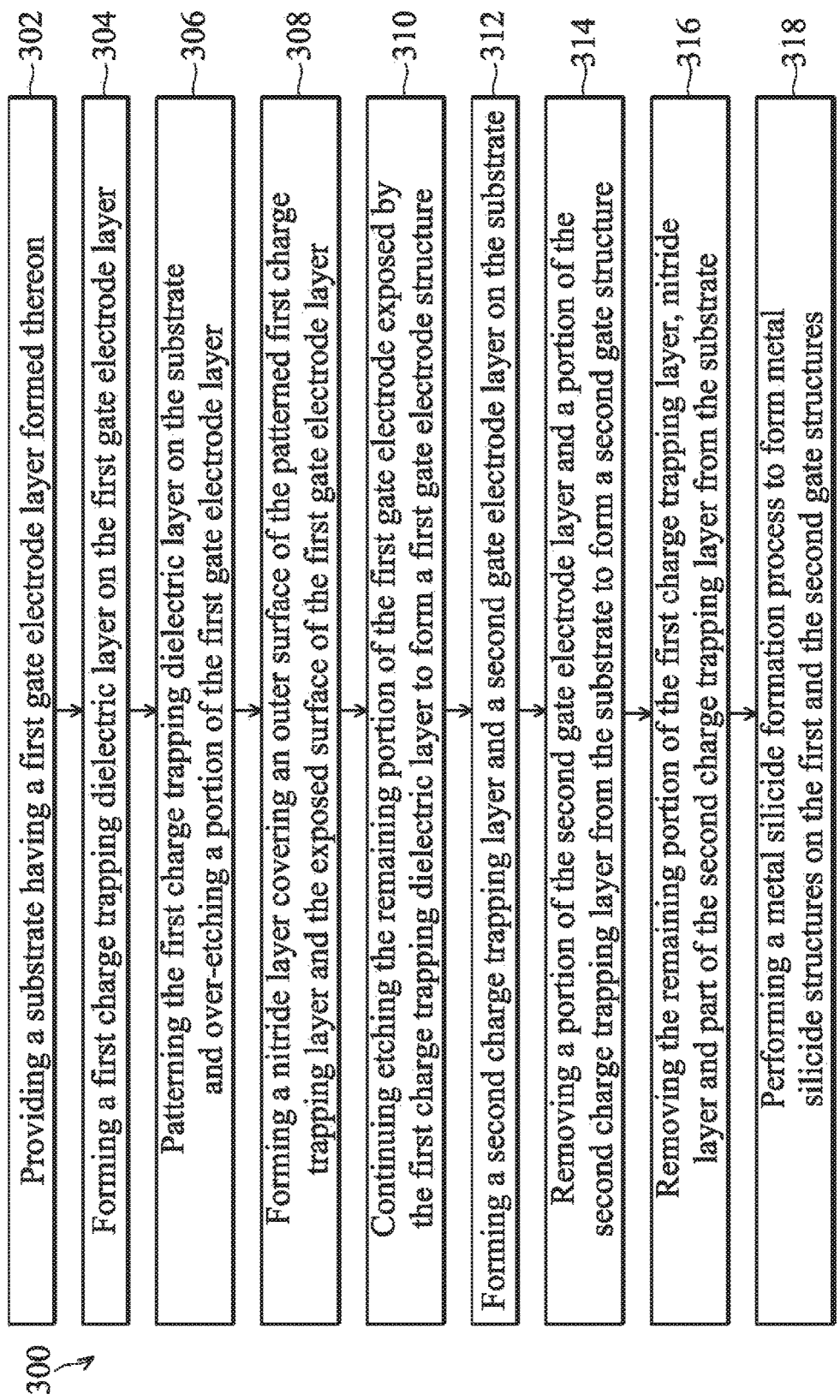
FIG. 3 depicts a flow chart of an exemplary process for manufacturing a memory device structure on a substrate in accordance with some embodiments

FIG. 3 depicts an, exemplary flow diagram of a process 300 performed to form a semiconductor device structure, such as corner recesses formed in a select gate structure depicted in FIGS. 1A-2B discussed above. FIGS. 4A-4I are schematic cross-sectional views of a portion of the substrate 101 corresponding to various stages of the process 300 in accordance with some embodiments. The example depicted in FIGS. 4A-4I utilizing the process 300 is configured to form the semiconductor device structure 100 as previously discussed with reference to FIGS. 1A-2B. However, it is noted that the process 300 as well as the exemplary structures depicted in FIGS. 4A-4I may be utilized to form any suitable structures, including the semiconductor device structure not presented herein.

The process 300 begins at operation 302 by providing the substrate 101 having a first gate electrode layer 125 that may be later patterned to form the select gate structure 124 on the substrate 101. In one example, the first gate electrode layer 125 may be a crystalline silicon material, doped or undoped polysilicon materials and the like. In one example, the first gate electrode layer 125 utilized to form the select gate structure 124 is a p-type or n-type doped polysilicon material, such as a p-type doped polysilicon material.

At operation 304, a first charge trapping dielectric 402 is formed on the first gate electrode layer 125, as shown in FIG. 4B. It is noted that the first charge trapping dielectric 402 as formed here may be a dummy dielectric, also called a sacrificial dielectric, which may be later removed after the structures and/or features are transferred and formed onto the substrate 101. The first charge trapping dielectric 402 comprise a single layer or multiple layers. In one example, the first charge trapping dielectric 402 includes an ONO structure having a first layer 402*a* formed by a silicon oxide material, a second layer 402*b* formed by a silicon nitride material and a third layer 402*c* formed by a silicon oxide material. It is noted that different types of the dielectric materials may also be utilized to form the dielectric 402 to assist defining the features/structures on the substrate 101.

A patterned hardmask layer 461 may be formed on the charge trapping dielectric 402 to define openings 462 therebetween. The openings 462 exposes a portion 463 of the first charge trapping dielectric 402 that may be patterned or etching in the subsequent manufacturing processes.

At operation 306, a patterning process is performed to pattern the first charge trapping dielectric 402, as shown in FIG. 4O, through the openings 462 defined by the patterned hardmask layer 461. The patterning process is performed to etch the portion 463 of the first charge trapping dielectric 402 unprotected by the patterned hardmask layer 461 from the substrate 101. The patterning process is continuously performed to over-etch a portion of the underlying the first gate electrode layer 125 away from the substrate 101 until a surface 464 of the first gate electrode layer 125 is exposed. The patterned hardmask layer 461 may be consumed and etched away at this operation during the patterning process. The over-etching of the first gate electrode layer 125 defines a top portion 469 having an inner sidewall 170 exposed and the top surface 199 in contact with the first charge trapping dielectric 402. The over-etching of the first gate electrode layer 125 is continuously performed to form the top portion 469 until a certain predetermined depth, such as the step height 210 described above, is reached. Thus, the over-etching process is set to be terminated when the desired step height 210 of the top portion 469 of the first gate electrode layer 12 is formed. The step height 210 defined by the top portion 469 may then later utilized to form the corner recesses 204*a*, 204*b* (e.g., top corners) for select gate structures 124.

In one example, the patterning gas mixture includes at least a halogen containing gas having a carbon element to pattern the first charge trapping layer 402 and a halogen containing gas to pattern (e.g., over etch) the first gate electrode layer 125 to form the top portion 469. Exemplary halogen containing gases having a carbon element (e.g., a carbon and halogen containing gas) include $CF_4$, $CHF_3$, $CH_2F_2$, $C_2F_6$, $C_2F_8$, $C_4F_6$ and the like. Suitable examples of the halogen containing gas include HBr, $CF_4$, $CHF_3$, HCl, $Cl_2$, $CH_2F_2$, $C_2F_6$, $C_2F_8$, $C_4F_6$, $SF_6$, $NF_3$, and the like. In one example, a carbon fluoride gas, such as $CF_4$, $CHF_3$, $CH_2F_2$, $C_2F_6$, $C_2F_6$, $C_4F_6$ and the like, may be used in the patterning gas mixture to pattern the first charge trapping layer 402 and the first gate electrode layer 125. In some examples, a different gas, such as a halogen containing gas, is utilized during the over-etching process to etch the first gate electrode layer 125. The halogen containing gas utilized to etch the first gate electrode layer 125 is HBr gas, with or without $Cl_2$, to define the top portion 469, which may be later utilized to form the corner recesses 204*a*, 204*b*.

At operation 308, after the top portion 469 is defined in the first gate electrode layer 125, a nitride layer 404 is then conformally formed on the substrate 101 covering the first charge trapping dielectric 402 as well as the first gate electrode layer 125. The nitride layer 404 is formed along the top surface 469 and along the inner sidewall 170 of the top portion 469 defined in the first gate electrode layer 125, extending further to the sidewall 465 and top surface 466 of the first charge trapping dielectric 402 to form a conformal protection on the substrate surface. The nitride layer 404 protects the top surface 466, the sidewalls 465, 170 of the first charge trapping layer 125 and the top portion 469 from damage in the series of depositions and patterning process subsequently performed.

In one embodiment, the nitride layer 404 may have a thickness that may be utilized to later define a width of the corner recesses 204a, 204b defined in the select gate structures 124a, 124b.

At operation 310, after the nitride layer 404 is formed, an etching and/or patterning process is performed to continue etching the first gate electrode layer 125 unprotected by the first charge trapping layer 402. The etching process is performed until a surface 470 of the substrate 101 is exposed, as shown in FIG. 4E. The etching process forms an opening 406 between the stand-alone select gate structures 124a, 124b. It is noted that the numbers of the select gate structures 124 formed on the substrate 101 may be varied or changed as needed. It is noted that the distance and dimension between the select gate structures 124a, 124b may be altered or may not reflect the dimension in real product for ease of description and explanation.

After the opening 406 is formed between the select gate structures 124a, 124b, the corner recesses 204a, 204b (e.g., a top corner) is then defined in the select gate structures 124a, 124b, as shown in FIG. 4E, with the nitride layer 404 filled therein, serving as an insulating structure at the corner recesses 204a, 204b (e.g., a top corner). As the step height 210 is already defined by the top portion 469 described above, the etching-through of the first gate electrode layer 125 at operation 310 further defines the width 212 of the corner recesses 204a, 204b formed in the select gate structures 124a, 124b. The opening 406 formed between the select gate structures 124a, 124b defines the outer sidewall 172 of the select gate structures 124a, 124b. The nitride layer 404 sits on and is interfaced with the bottom surface 196 of the corner recesses 204a, 204b of the select gate structures 124a, 124b and extends upwards and remains in contact with the sidewall 465 and top surface 466 of the first charge trapping layer 402. The nitride layer 404 remaining in the corner recesses 204a, 204b assists maintaining the contour of the corner recesses 204a, 204b and protects the bottom surface 196 of the corner recesses 204a, 204b from damage in the series of depositions and patterning process subsequently performed.

Figures 4F, 4G:
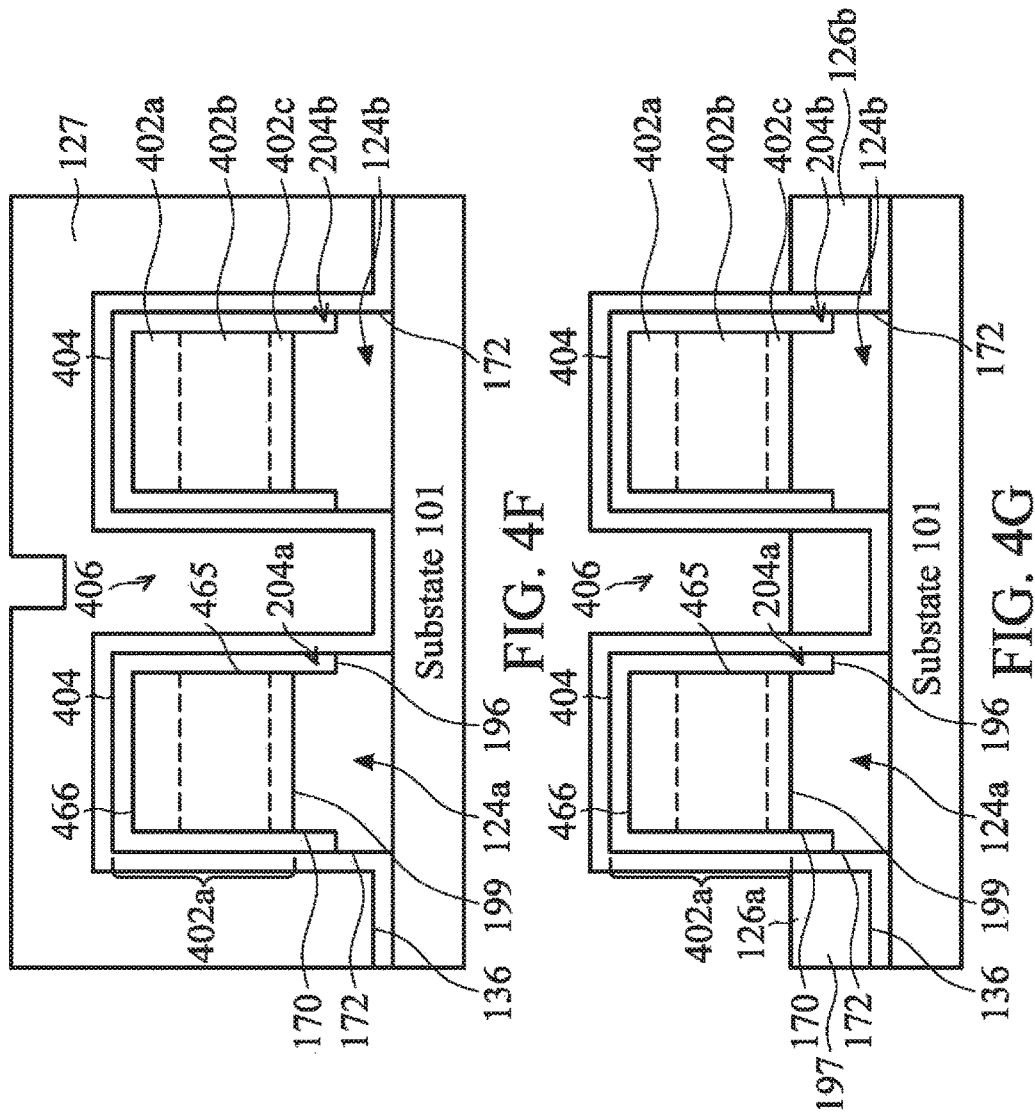

At operation 312, a second charge trapping layer 136 and a second gate electrode layer 127 is formed on the substrate 101, as shown in FIG. 4F. The second charge trapping layer 136 may comprise a single layer or multiple layers. In one example, the second charge trapping layer 136 is similar to the first charge trapping layer 402 having a ONO structure, such as having a first layer 136(i) formed by a silicon oxide material, a second layer 136(ii) formed by a silicon nitride material and a third layer 136(iii) formed by a silicon oxide material, as circled and shown in the enlarged view in FIG. 4F(a). It is noted that different types of the dielectric materials may also be utilized to form the second charge trapping layer 136, such as a NON (e.g., silicon nitride-silicon oxide-silicon nitride) structures, OSiO (e.g., silicon oxide-silicon-silicon oxide) and other suitable materials.

The second gate electrode layer 127 formed on the second charge trapping layer 136 that may be later patterned to form the memory gate structure 126 on the substrate 101. In one example, the second gate electrode layer 127 may be a crystalline silicon material, doped or undoped polysilicon materials and the like. In one example, the second gate electrode layer 127 utilized to form the memory gate 126 is a p-type or n-type doped polysilicon material.

At operation 314, a patterning process is performed, to remove the excess second gate electrode layer 127 from the substrate 101, forming the memory gate 126a, 126b on the substrate, as shown in FIG. 4G. The removal of the excess second gate electrode material 127 defines the top surface 197 of the memory gate structures 126a, 126b, partially bounded by the second charge trapping layer 136. The second charge trapping layer 136 surrounds a sidewall and bottom surface of the memory gate structures 126a, 126b.

At operation 314, a series of patterning processes are performed to remove the excess second charge trapping layer 136 above the top surface 197 of the memory gate structures 126a, 126b, as well as the remaining first charge trapping layer 402 and the nitride layer 404 from the substrate 101, as shown in FIG. 4H. A portion of the nitride layer 404 may remain, filling in the corner recesses 204a, 204b on the substrate 101 so as to protect the bottom surface 196 of the corner recesses 204a, 204b of the select gate structures 124a, 124b as well as maintaining desired electrical performance. The removal of the excess second gate electrode layer 127 in the opening 406, the excess nitride layer 404 and the first charge trapping layer 402 is followed by a deposition process to form the interlayer insulating substructure 150 between the select gate structures 124a, 124b.

At this stage, as discussed above, the nitride layer 404 may remain in the corner recesses 204a, 204b of the select gate structures 124a, 124b serving as an insulating structure at the corner recesses 204a, 204b (e.g., a top corner) for interface protection and device performance control. Alternatively, the nitride layer 404 may be removed and replaced with other suitable dielectric materials, such as silicon oxide, silicon oxynitride, metal dielectric materials, or high-k materials as needed.

The top surface 199 of the select gate structures 124a, 124b is also exposed at this stage, defining the width 202a, 202b of the top portion 469 of the select gate structures 124a, 124b. The corner recesses 204a, 204b provide the enlarged spacing 206a, 206b from the inner sidewall 170 of the select gate structures 124a, 124b to the shared sidewall 174 shared between the second charge trapping layer 136 and the memory gate 126a, 126b.

At operation 318, after the corner recesses 204a, 204b are defined with the nitride layer 404 optionally filled therein, a silicidation process is then performed to form the memory silicide contact pads 160, 162 over upper top surfaces 199, 197 of the select gate 124 and the memory gates 126, as shown in the FIG. 4I.

Figure 5:
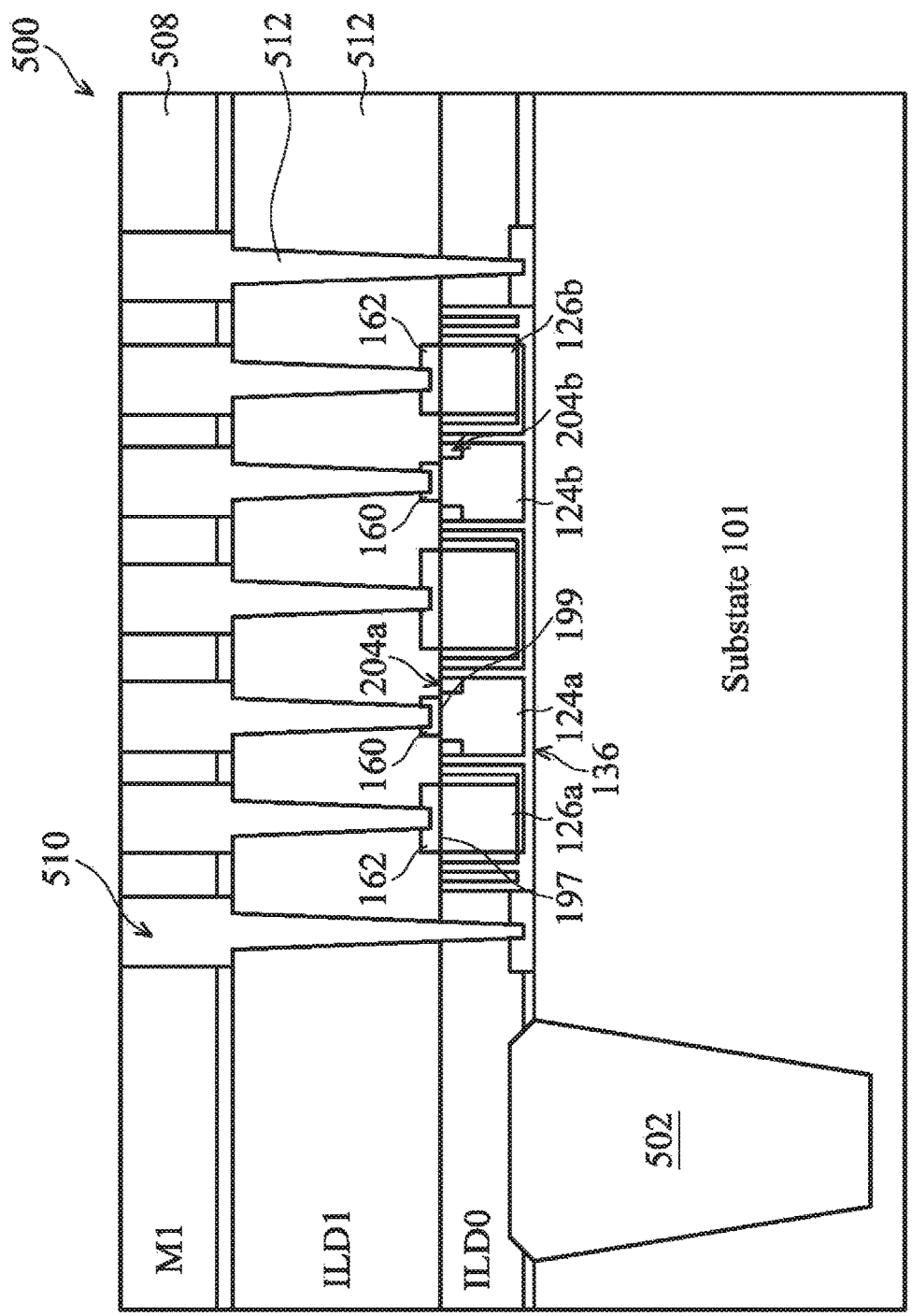
FIG. 5 depicts a cross-sectional view of a substrate with an array of memory cells formed therein in accordance with some embodiments.

FIG. 5 depicts a cross sectional view of a semiconductor device 500 utilizing the corner recesses 204a, 204b formed in the select gate structures 124a, 124b so that an enlarged spacing between the memory silicide contact pad 160, 162 is formed over upper top surfaces 199, 197 of the select gate structures 124 and the memory gate structures 126 are obtained. After the formation of the select gate structures 124 and the memory gate structures 126, metal plugs 512 may be formed in the interlayer dielectric material 152 connecting the memory silicide contact pad 160, 162 to the metal structures 510 formed in the first metal interconnection insulating structure 508 (e.g., or called metal one dielectric structure). Although only a shallow trench isolation structure 502 is formed and embedded in the substrate 101, it is noted that other structures and layers may be formed in and on the substrate 101 but not described here for sake of brevity and clarity.

Thus, an integrated circuit for a flash memory device with enlarged spacing between select gate structures and memory gate structures is provided. The enlarged spacing formed between silicide contact pads in the select gate structures and memory gate structures advantageously provides a wide process window during a planarization process to prevent metal contamination from being trapped in the spacing. The enlarged spacing is obtained by forming corner recesses at the select gate in the memory cells so that a top surface with, a reduced dimension of the select gate are provided and obtained. The corner recesses may be filled with a dielectric structure to provide a planar surface as needed.

In an embodiment, a semiconductor device structure includes a semiconductor substrate having memory cell devices formed thereon, the memory cell devices including a plurality of select gate structures, and a plurality of memory gate structures formed adjacent to the plurality of select gate structures, wherein at least one of the plurality of select gate structures have a corner recess formed below a top surface of the at least one of the plurality of select gate structures.

In another embodiment, a method for forming a semiconductor device structure includes etching a first charge trapping dielectric exposed by a patterned hardmask layer disposed on the substrate to form a patterned first charge trapping dielectric, over-etching a portion of a first gate electrode layer using the patterned first charge trapping dielectric as a mask until a predetermined depth of the portion of the first gate electrode layer is reached, forming a conformal dielectric layer on the substrate covering the patterned charge trapping dielectric and sidewalls of the portion of the first gate electrode layer, continuing etching the first gate electrode layer using the patterned charge trapping dielectric as a mask and the dielectric layer as sidewall protection of the portion of the first gate electrode layer until a surface of the substrate is exposed, and forming a select gate structure from the first gate electrode layer having recesses filled by the dielectric layer interfaced with the sidewalls of the portion of the first gate electrode layer.

In yet another embodiment, a semiconductor device structure includes a semiconductor substrate having memory cell devices formed thereon, wherein the memory cell devices include a select gate structure, wherein the select gate structure has a top surface having a first width shorter than a second width of a bottom surface the select gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without, departing from the spirit and scope of the present disclosure.

The invention claimed is:

1. A semiconductor device structure, comprising:
   a semiconductor substrate having memory cell devices formed thereon, the memory cell devices including:
   a plurality of select gate structures; and
   a plurality of memory gate structures formed adjacent to the plurality of select gate structures, wherein at least a first select gate structure of the plurality of select gate structures has a corner recess formed below a top surface of the first select gate structure, wherein the corner recess is filled with an insulating structure, wherein the first select gate structure is adjacent a first memory gate structure of the plurality of memory gate structures, wherein the top surface of the first select gate structure is located at a greater distance from the first memory gate structure than it would be in the absence of the corner recess.

2. The semiconductor device structure of claim 1, wherein the corner recess has a bottom surface recessed below a top surface of the first memory gate structure.

3. The semiconductor device structure of claim 1, further comprising:
   a charge trapping layer disposed between the first select gate structure and the first memory gate structure partially bounding a sidewall and a bottom surface of the first memory gate structure.

4. The semiconductor device structure of claim 3, wherein the charge trapping layer has a top surface substantially coplanar with the top surface of the first select gate structure and a top surface of the first memory gate structure.

5. The semiconductor device structure of claim 3, wherein the charge trapping layer includes a composite structure having at least three layers.

6. The semiconductor device structure of claim 3, wherein the corner recess has a side interfaced with the charge trapping layer.

7. The semiconductor device structure of claim 1, wherein the corner recess has a width between about 10 percent and about 30 percent shorter than a total horizontal width of the first select gate structure.

8. The semiconductor device structure of claim 1, wherein the corner recess has a step height between about 10 percent and about 30 percent shorter than a total vertical height of the first select gate structure.

9. The semiconductor device structure of claim 1, wherein the corner recess is substantially in rectangular or square forms.

10. The semiconductor device structure of claim 1, wherein a plurality of metal silicide contact pads are formed on the top surface of the first select gate structure and a top surface of the first memory gate structure.

11. The semiconductor device structure of claim 10, wherein the metal silicide contact pads are fabricated from a nickel and platinum containing alloy.

12. The semiconductor device structure of claim 1, wherein a first spacing defined between an inner sidewall of the first select gate structure and a sidewall of the first memory gate structure is between about 15 percent and about 40 percent larger than a second spacing defined between an outer sidewall of the first select gate structure and the sidewall of the first memory gate structure.

13. The semiconductor device structure of claim 1, wherein the insulating structure is connected to an interlayer dielectric material disposed adjacent to the select gate structures and the memory gate structures.

14. The semiconductor device structure of claim 13, wherein the corner recess has a side interfaced with the interlayer dielectric material.

15. A semiconductor device structure, comprising:
    a semiconductor substrate having memory cell devices formed thereon, wherein the memory cell devices include a select gate structure, wherein the select gate structure has a top surface having a first width shorter than a second width of a bottom surface of the select gate structure, and wherein a center point of the top surface sits directly above a center point of the bottom surface; and a nitride layer along an upper portion of a sidewall of the select gate structure, wherein the nitride layer fills a corner recess formed below a top surface of the select gate structure.

16. The semiconductor device structure of claim 15, further comprising:

a charge trapping layer directly contacting the select gate structure, wherein the nitride layer is interposed between the charge trapping layer and the select gate structure.

17. The semiconductor device structure of claim 16, further comprising a memory gate structure, wherein the nitride layer is interposed between the select gate structure and the memory gate structure.

18. The semiconductor device structure of claim 15, further comprising a memory silicide contact pad along an upper top surface of the select gate structure.

19. A semiconductor device structure, comprising:

a select gate structure;

a nitride layer along an upper portion of a first sidewall of the select gate structure and along an upper portion of a second sidewall of the select gate structure;

a charge trapping layer along a lower portion of the first sidewall of the select gate structure and a first sidewall of the nitride layer and along a lower portion of the second sidewall of the select gate structure and along a second sidewall of the nitride layer; and a memory gate structure, wherein the select gate structure and the memory gate structure contact opposing sidewalls of the charge trapping layer, wherein the nitride layer is interposed between the charge trapping layer and the select gate structure; and an interlayer insulating substructure, wherein the select gate structure and the interlayer insulating structure contact opposing sidewalls of the charge trapping layer, wherein the nitride layer is interposed between the charge trapping layer and the select gate structure.

20. The semiconductor device structure of claim 19, wherein a width of the select gate structure adjacent the nitride layer is less than a width of the select gate structure adjacent the charge trapping layer.

* * * * *